United States Patent
Fischetti et al.

(10) Patent No.: US 7,968,946 B2
(45) Date of Patent: Jun. 28, 2011

(54) HIGHER PERFORMANCE CMOS ON (110) WAFERS

(75) Inventors: Massimo V. Fischetti, Putnam Valley, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 12/122,227

(22) Filed: May 16, 2008

(65) Prior Publication Data

US 2008/0217691 A1    Sep. 11, 2008

Related U.S. Application Data

(63) Continuation of application No. 11/327,256, filed on Jan. 6, 2006.

(51) Int. Cl.
*H01L 21/70* (2006.01)

(52) U.S. Cl. .............. 257/369; 438/198; 257/E23.141; 257/E21.24

(58) Field of Classification Search .......... 257/19, 257/369, 351; 438/198, 193, 168
See application file for complete search history.

(56) References Cited

U.S. PATENT DOCUMENTS

| | | | | |
|---|---|---|---|---|
| 7,160,769 | B2* | 1/2007 | White et al. | 438/198 |
| 2004/0142545 | A1* | 7/2004 | Ngo et al. | 438/585 |
| 2005/0260806 | A1* | 11/2005 | Chang et al. | 438/197 |
| 2006/0220113 | A1* | 10/2006 | Tamura et al. | 257/335 |
| 2006/0267100 | A1* | 11/2006 | Noguchi et al. | 257/351 |
| 2007/0252144 | A1* | 11/2007 | Peidous et al. | 257/57 |
| 2007/0269963 | A1* | 11/2007 | Cheng et al. | 438/479 |
| 2008/0020515 | A1* | 1/2008 | White et al. | 438/118 |

OTHER PUBLICATIONS

Mizuno, T. et al., "(110)-Surface Strained-SOI CMOS Devices" IEEE Transactions on Electron Devices, Mar. 2005, pp. 367-374, vol. 52, No. 3.

Mizuno, T. et al., "(110)-Surface Strained-SOI CMOS Devices with Higher Carrier Mobility" Symposium on VLSI Technology Digest of Technical Papers, Jun. 10-12, 2003, pp. 97-98.

Nakamura, H. et al., "Effects of Selecting Channel Direction in Improving Performance of Sub-100 nm MOSFETs Fabricated on (110) Surface Si Substrate" Japanese Journal of Applied Physics, 2004, pp. 1723-1728, vol. 43, No. 4B.

A. Shimizu et al. "Local Mechanical-Stress Control (LMC): A New Technique for CMOS-Performance Enhancement", 2001 IEEE IEDM Tech. Digest, pp. 433-436.

Shinya Ito et al. "Mechanical Stress Effect of Etch-Stop Nitride and its Impact on Deep Submicron Transistor Design", 2000 IEEE IEDM Tech. Digest, pp. 247-250.

F. Ootsuka et al. "A Highly Dense, High-Performance 130 nm Node CMOS Technology for Large Scale System-on-a-Chip Applications", 2000, IEEE IEDM Tech. Digest, pp. 575-578.

H.S. Yang et al. "Dual Stress Liner for High Performance sub-45 nm Gate Length SOI CMOS Manufacturing", IEEE IEDM 2004 Tech. Digest, pp. 1075-1077.

* cited by examiner

*Primary Examiner* — Chuong A Luu
*Assistant Examiner* — Nga Doan
(74) *Attorney, Agent, or Firm* — Scully, Scott, Murphy & Presser, P.C.; Vazken Alexanian

(57) ABSTRACT

A semiconductor (e.g., complementary metal oxide semiconductor (CMOS)) structure formed on a (110) substrate that has improved performance, in terms of mobility enhancement is provided. In accordance with the present invention, the inventive structure includes at least one of a single tensile stressed liner, a compressively stressed shallow trench isolation (STI) region, or a tensile stressed embedded well, which is used in conjunction with the (110) substrate to improve carrier mobility of both nFETs and pFETs. The present invention also relates to a method of providing such structures.

13 Claims, 6 Drawing Sheets

HIGHER PERFORMANCE CMOS ON (110) WAFERS

RELATED APPLICATIONS

This application is a continuation of U.S. patent application Ser. No. 11/327,256, filed Jan. 6, 2006.

FIELD OF THE INVENTION

The present invention relates to a semiconductor structure and more particularly to a complementary metal oxide semiconductor (CMOS) formed on a (110) substrate that has improved performance, in terms of carrier mobility enhancement. In accordance with the present invention, the inventive structure includes at least one of a single tensile stressed liner, a compressively stressed shallow trench isolation (STI) region, or a tensile stressed embedded well in the source/drain areas, which is used in conjunction with the (110) substrate to improve carrier mobility of both nFETs and pFETs. The present invention also relates to a method of providing such structures.]

BACKGROUND OF THE INVENTION

Recently, there have been numerous attempts to utilize stress in order to improve the performance of CMOS field effect transistor (FET) devices. Uniaxial stress can be introduced by various techniques. Among them, the use of a stressed nitride film deposited over a polysilicon (polySi) gate structure has been widely adopted. Such a technique for introducing stress into the channel regions of FETs is reported, for example, in A. Shimizu et al. "Local Mechanical-Stress Control (LMC): A New Technique for CMOS-Performance Enhancement", 2001 IEEE IEDM Tech. Digest, pp. 433-436; Shinya Ito et al. "Mechanical Stress Effect of Etch-Stop Nitride and its Impact on Deep Submicron Transistor Design", 2000 IEEE IEDM Tech. Digest, pp. 247-250; and F. Ootsuka et al. "A Highly Dense, High-Performance 130 nm Node CMOS Technology for Large Scale System-on-a-Chip Applications", 2000, IEEE IEDM Tech. Digest, pp. 575-578.

However, on conventional (100) semiconductor wafers, two kinds of stressed liners are needed in order to improve both the electron and hole mobility at the same time, namely, the use of a tensile stressed liner for nFETs and the use of a compressively stressed liner for pFETs. See, for example, H. S. Yang et al. "Dual Stress Liner for High Performance sub-45 nm Gate Length SOI CMOS Manufacturing", IEEE IEDM 2004 Tech. Digest, pp. 1075-1077. Thus, use of two different types of stressed liners adds to the complexity of the process and requires an additional mask, thus rendering processing of such CMOS devices more costly and making it more difficult to obtain a high production yield.

In addition, stressed shallow trench isolation (STI) tends to induce stress (compressive, in most cases) in the device channels. On (100) wafers, transverse compressive stress increases the electron mobility, while it decreases the hole mobility. Hence, the narrow-width effect is opposite for nFETs and pFETs.

Despite the advances made in fabricating semiconductor structures with enhanced carrier mobility, there is still a continued need for providing new and improved semiconductor structures having enhanced carrier mobility, which overcome the drawbacks mentioned herein above.

SUMMARY OF THE INVENTION

The present invention provides a semiconductor structure in which at least one of a single tensile stressed liner, a compressively stressed shallow trench isolation (STI) region, or a tensile stressed embedded well in the source/drain areas is used to improve the carrier mobility in both nFETs and pFETs. In accordance with the present invention, this improved carrier mobility is achieved when a semiconductor substrate (bulk, a semiconductor-on-insulator (SOI), bi-axially strained or unstrained/relaxed) is used that has a (110) surface.

In addition, the present invention also discloses that a single compressively stressed shallow trench isolation (STI) can improve both the electron and hole mobility in narrow-width devices, which is excepted to be an additive to the enhancement causes by the single tensile stressed liner.

According to Monte Carlo simulations performed by the applicants of the present application, both electron and hole mobility on a (110) surface along the <100> channel direction increases with uniaxial longitudinal tensile stress and/or transverse compressive stress. This is quite unique because normally opposite stresses are needed for improving electron and hole mobility for the conventional <100> channel on a (100) substrate. The applicants of the present application took advantage of the aforementioned feature to fabricate high performance semiconductor structures using a simplified process and lower production cost.

In general terms, the structure of the present invention comprises:
a semiconductor substrate having a (110) surface; and
at least one nFET and at least one pFET located on said semiconductor substrate, wherein said at least one nFET and said at least one pFET both have a strained channel along a <100> channel direction.

In accordance with the present invention, the strained channels can be a result of including at least one of a single tensile stressed liner, a compressively stressed shallow trench isolation (STI) region, or a tensile stressed embedded well in the structure. In one embodiment, the strained channels can be a result of using a single tensile stressed liner by itself on both the nFET and pFET devices. In another embodiment of the present invention, a compressively stressed STI, singly or in combination with a single tensile stressed liner is used. In yet another embodiment, a tensile stressed embedded well in the source/drain areas, singly or in combination with a tensile stressed liner and/or a compressively stressed STI is used. In a further embodiment of the present invention, the strain in the channel can be created by applying the above uniaxial stress (singly or in combination) to an existing bi-axially strained channel on the (110) surface. The bi-axial strain can be created by well-known methods such as epitaxial growth of the first semiconductor on the second semiconductor substrate which has a different lattice constant than the first semiconductor, for example, tensile strained Si on relaxed SiGe substrate, which can be bulk or SGOI (SiGe on insulator) or SSDOI (strained Si directly on insulator).

In addition to the general structure disclosed above, the present invention also provides a method of fabricating the same. In general terms, the method of the present application comprises:
forming at least one nFET and at least one pFET located on a semiconductor substrate having a (110) surface, wherein said at least one nFET and said at least one pFET both have a strained channel along a <100> channel direction.

In accordance with the present invention and as stated above, the strained channels can be a result of including at least one of a single tensile stressed liner, a compressively stressed shallow trench isolation (STI) region, or a tensile stressed embedded well in the structure. In one embodiment, the strained channels can be a result of using a single tensile stressed liner by itself on both the nFET and pFET devices. In another embodiment of the present invention, a compressively stressed STI, singly or in combination with a single tensile stressed liner is used. In yet another embodiment, a tensile stressed embedded well, singly or in combination with a tensile stressed liner and/or a compressively stressed STI is used. In a further embodiment of the present invention, the above uniaxial stress (singly or in combination) can be applied to a bi-axially strained substrate.

BRIEF DESCRIPTION OF THE DRAWINGS

FIG. 5A illustrates an embodiment of the present invention in which a single tensile stressed liner and a compressively stressed STI are used. FIG. 5B illustrates an embodiment of the present invention in which stressed embedded wells (e.g., stressed source/drain regions), and a compressively stressed STI are used. FIG. 5C illustrates an embodiment of the present invention in which a single tensile stressed liner, tensile stressed embedded wells and a compressively stressed STI are used. The substrate in above embodiments depicted in FIGS. 5A-5C can be bulk or SOI, relaxed or bi-axially tensile strained.

DETAILED DESCRIPTION OF THE INVENTION

Figure 2:
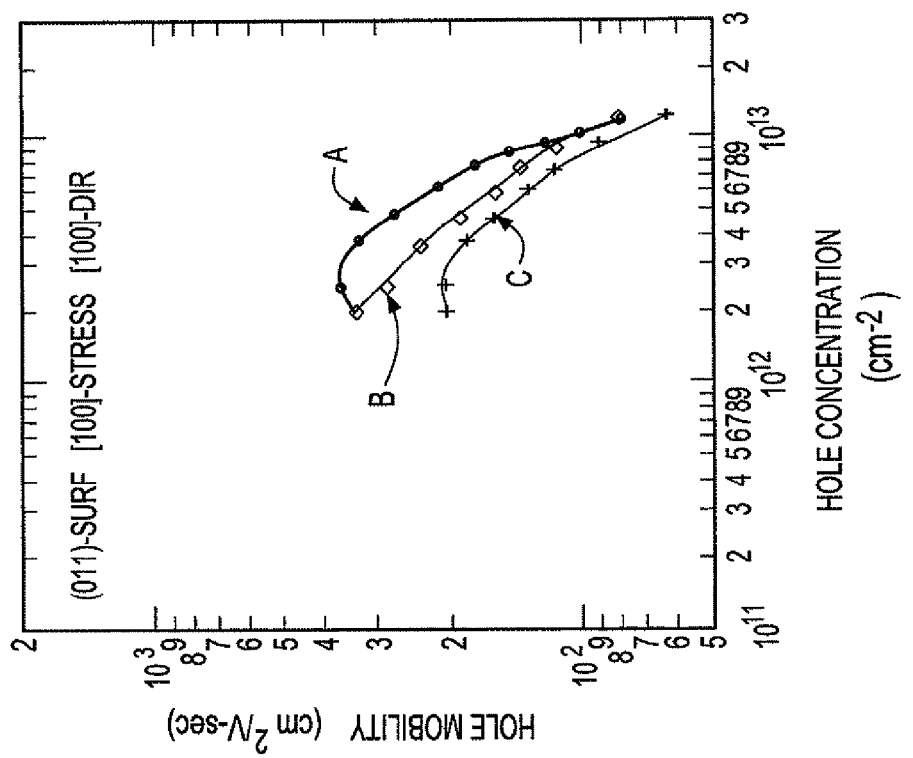
FIG. 2 is a graph plotting the simulated hole mobility vs. inversion electron concentration for 1% tensile and compressive longitudinal uniaxial stress for <100> channels on (110) substrates. The mobility for the relaxed channel is also plotted.

The present invention, which provides a semiconductor structure having enhanced carrier mobility and a method of fabricating the same, will now be described in greater detail by referring to the following discussion and drawings that accompany the present application. It is noted that the drawings of the present application are provided for illustrative purposes and, as such, they are not drawn to scale. It is noted that in the drawings like and/or corresponding elements are referred to by like reference numerals.

As stated above, the present invention provides a semiconductor structure formed on a (110) substrate that has improved performance, in terms of carrier mobility enhancement. In accordance with the present invention, the inventive structure includes at least one of a single tensile stressed liner, a compressively stressed shallow trench isolation (STI) region, or a tensile stressed embedded well, which is used in conjunction with the (110) substrate to improve carrier mobility of both nFETs and pFETs. In general terms, the semiconductor structure includes a semiconductor substrate having a (110) surface; and at least one nFET and at least one pFET located on the semiconductor substrate, wherein the at least one nFET and the at least one pFET both have a strained channel along a <100> channel direction.

Figure 1:
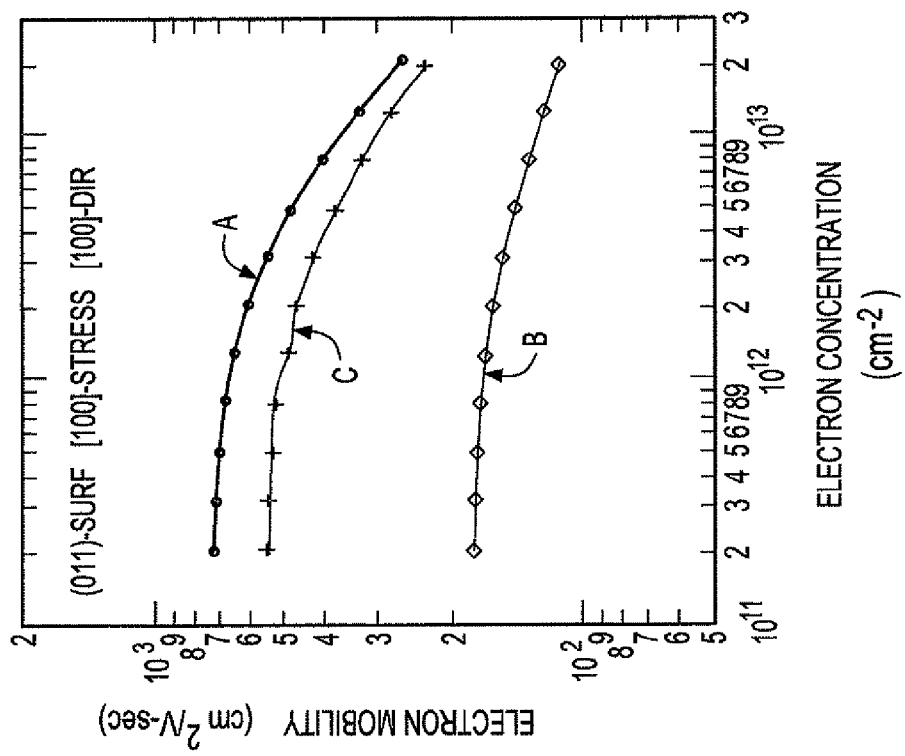
FIG. 1 is a graph plotting the simulated electron mobility vs. inversion electron concentration for 1% tensile and compressive longitudinal uniaxial stress for <100> channels on (110) substrates. The mobility for the relaxed channel is also plotted.
Figure 3:
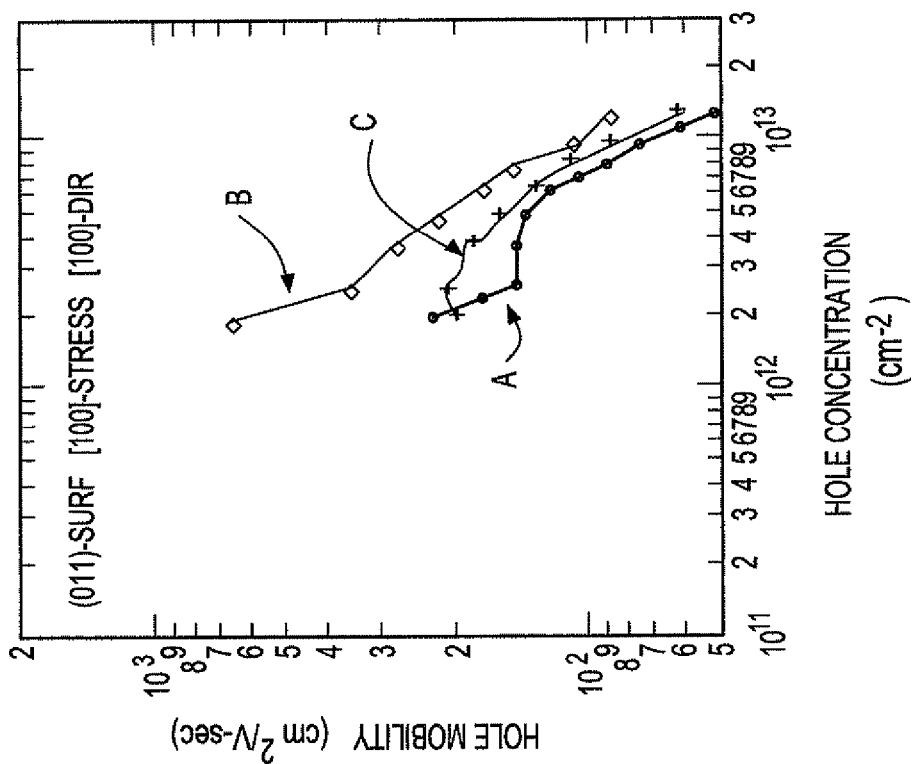
FIG. 3 is a graph plotting the simulated electron mobility vs. inversion electron concentration for 1% tensile and compressive transverse uniaxial stress for <100> channels on (110) substrates. The mobility for the relaxed channel is also plotted.
Figure 4:
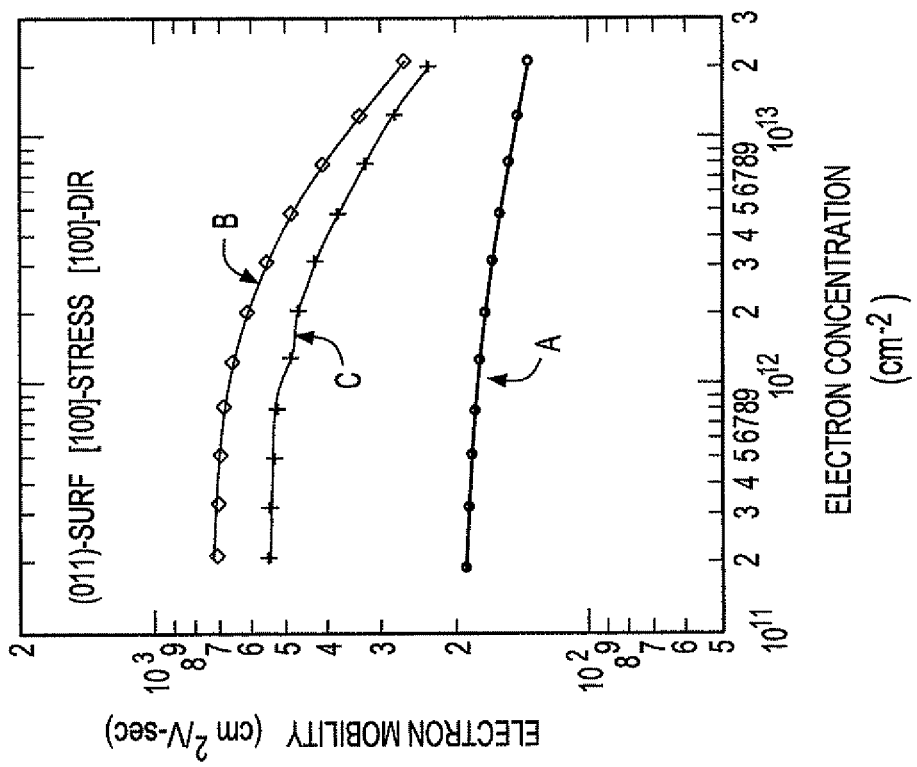
FIG. 4 is a graph plotting the simulated hole mobility vs. inversion electron concentration for 1% tensile and compressive transverse uniaxial stress for <100> channels on (110) substrates. The mobility for the relaxed channel is also plotted.

Without wishing to be bound by any theories, the carrier mobility enhancement in <100> channels on (110) substrates due to stress can be explained by reduced carrier effective mass and/or reduced inter-or intra-band (for electrons) or inter-or intra-valley (for holes) phonon scattering. As shown in FIGS. 1 and 2, both electron and hole mobility on a (110) surface along the <100> channel direction increases with uniaxial longitudinal tensile stress. The uniaxial longitudinal tensile stress can be obtained by including a tensile stressed liner around the pFET and nFET devices. It is noted that in FIGS. 1 and 2 (as well as FIGS. 3 and 4), "A" denotes 1% tensile strain, "B" denotes 1% compressive strain, and "C" denotes a relaxed state. As shown in FIGS. 3 and 4, both electron and hole mobility on (110) surface along the <100> channel direction increases with transverse compressive stress. These findings are unique because normally opposite stresses are needed for improving electron and hole mobility for a conventional <100> channel on a (100) substrate.

Inventive Structures:

As indicated above, the present invention provides a semiconductor structure having enhanced carrier mobility that broadly includes a semiconductor substrate having a (110) surface; and at least one nFET and at least one pFET located on the semiconductor substrate, wherein the at least one nFET and the at least one pFET both have a strained channel along a <100> channel direction. In accordance with the present invention, the strained channels are formed by providing at least one of a single tensile stressed liner, a compressively stressed shallow trench isolation (STI) region, or a tensile stressed embedded well (in the source/drain areas) to the structure. In one embodiment, the strained channels can be a result of using a single tensile stressed liner by itself on both the nFET and pFET devices. In another embodiment of the present invention, a compressively stressed STI, singly or in combination with a single tensile stressed liner is used. In yet another embodiment, a tensile stressed embedded well, singly or in combination with a tensile stressed liner and/or a compressively stressed STI is used.

Figure 5A:
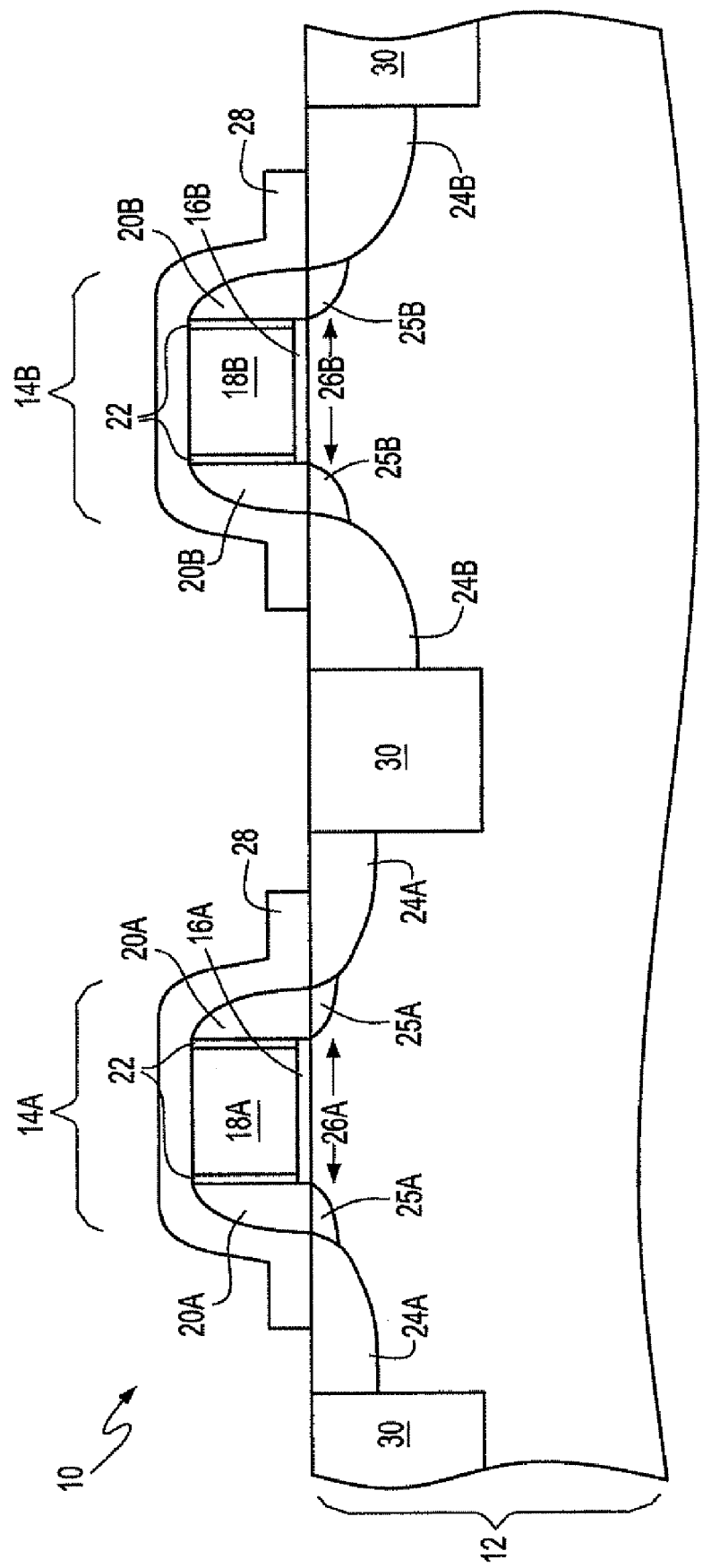
FIGS. 5A-5C are pictorial representations (through cross sectional views) depicting semiconductor structures of the present invention.
Figure 5B:
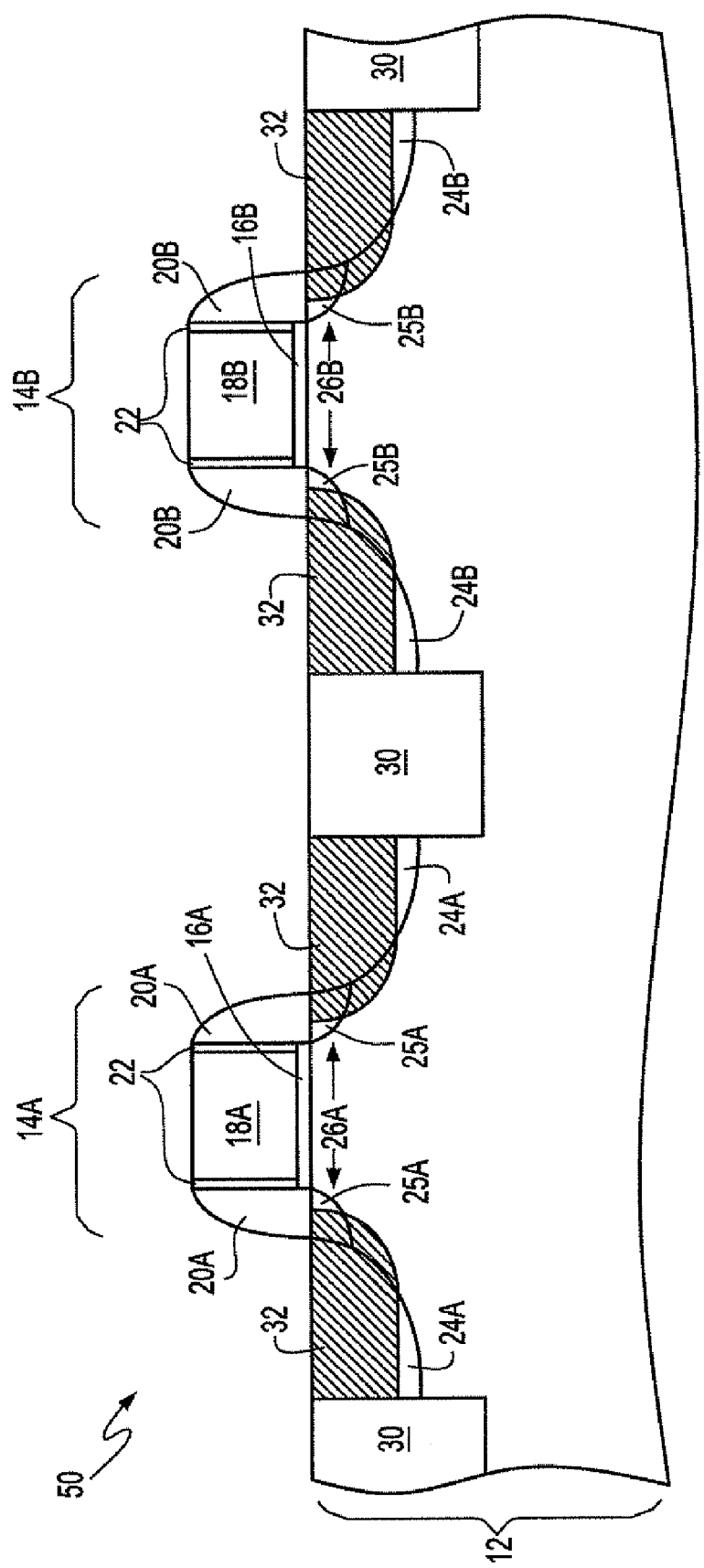
Figure 5C:
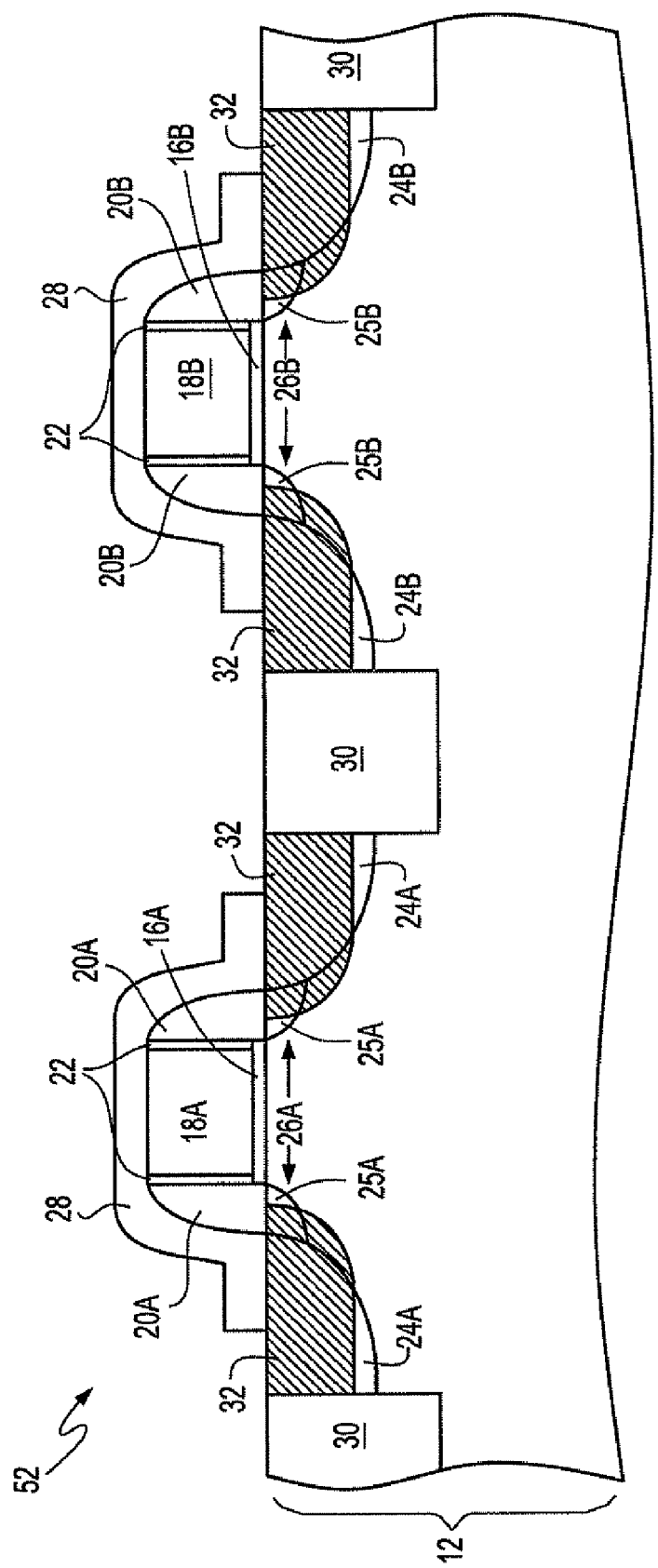

FIGS. 5A-5C are pictorial representations (through cross sectional views) of some of the embodiments of the present invention. Specifically, FIG. 5A shows a structure 10 that includes a semiconductor substrate 12 that includes at least one nFET device 14A and at least one pFET device 14B on a surface thereof. Each FET includes a gate dielectric (16A and 16B, respectively), a gate electrode (18A and 18B, respectively) and at least one side spacer (20A and 20B, respectively). Optionally, the sidewalls of each FET may include a passivation layer located 22 thereon.

Each of the FETs shown in FIG. 5A also includes source/drain regions (24A and 24B, respectively) and optional source/drain extensions (25A and 25B) which are located in the substrate 12, which can be bulk or SOI, bi-axially strained or relaxed. A channel (26A and 26B) that is strained (i.e., under stress) is located in the substrate 12 beneath each of the FETs. The strained channel (26A and 26B, respectively) is laterally confined by the source/drain extensions that are present in the substrate 12.

In the embodiment illustrated, the strained channels are formed by forming a single tensile stressed liner 28 on a portion of the substrate 12 as well as around both the nFET 14A and the pFET 14B. FIG. 5A also shows the presence of a compressively stressed STI 30 that is located within the substrate 12 between adjacent FETs of different conductivities. It is noted that the present invention contemplates a structure in which either the tensile stressed liner 28 or the compressively stressed STI 30 is absent from the structure.

Another possible structure 50 of the present invention is shown in FIG. 5B. The structure 50 shown in FIG. 5B includes tensile stressed embedded wells 32 in the source/drain areas instead of the tensile stressed liner 28 shown in FIG. 5A. The other elements shown in FIG. 5B are the same as that shown in FIG. 5A. Note that the present invention contemplates a structure in which either the tensile stressed embedded wells 32 or the compressively stressed STIs 30 is absent from the structure.

FIG. 5C shows a structure 52 that includes all three stressed inducing elements, e.g., tensile stressed liner 28, compressively stressed STI 30, and tensile stressed embedded wells 32. The substrate 12 and the elements of the nFETs 14A and 14B are the same as described above.

Figure 6:
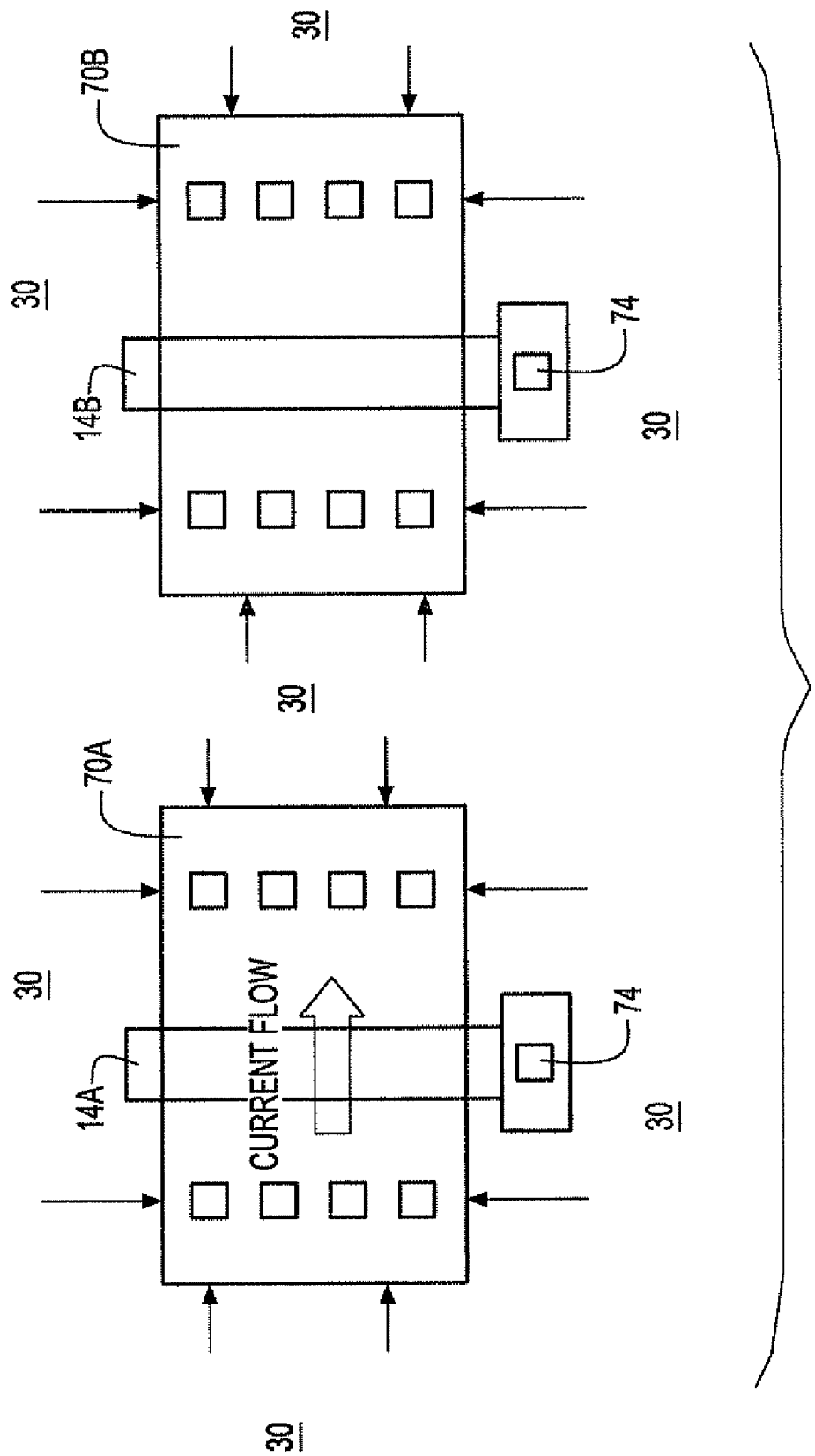
FIG. 6 is a schematic pictorial representation (of a top-down view) to illustrate the tensile longitudinal stress provided by the stressed liner or embedded stressed wells and the compressive transverse stress provided by the stressed STI.

Before describing the material components of the inventive structures shown above, reference is made to FIG. 6 which is a top-down schematic view which illustrates the tensile longitudinal stress provided by liner 28 or embedded well 32 and stressed STI 30. In this drawing, reference numerals 14A and 14B refer to the nFET and the pFET, respectively—the gates of each FET are shown; reference numerals 70A and 70B denote the active area of the nFET and pFET, respectively, while reference numeral 30 denotes the stressed STI. The contacts to the gates are also shown and are labeled by reference numeral 74 in this drawing. The arrows show the compressive stress created by the STI 30 surrounding the active area 70A and 70B. Along the longitudinal direction (i.e., parallel to current flow), the compressive stress compensates the tensile stress created by the liner 28. The net longitudinal stress in the channel in this embodiment is preferably tensile. The stress in the channel along the transverse direction (i.e., perpendicular to the current flow) is compressive.

Material Components for the Inventive Structures Illustrated in FIGS. 5A-5B.

This section provides a description of the various materials that can be present in the structures of the present application.

Common to each of the structure is semiconductor substrate 12. In accordance with the present invention, and unlike prior art structures, the substrate 12 has a (110) surface. The semiconductor substrate 12 includes any semiconductor material that can have a (110) surface. Illustratively, the semiconductor substrate 12 may comprise Si, SiC, SiGeC, Ge, SiGe, Ge, GaAs, InAs, InP as well as other III/V or II/VI compound semiconductors. Layered semiconductors such as, for example, Si/SiGe and semiconductor-on-insulators (SOIs) are also contemplated herein. Typically, the semiconductor substrate 12 is a Si-containing semiconductor such as, for example, Si, SiC, SiGe, SiGeC, or a silicon-on-insulator. The substrate 12 may be unstrained, strained or include regions of strain and unstrain therein. The substrate 12 may be intrinsic or it may be doped with, for example, but not limited to: B, As or P.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

In addition to the substrate 12 which has a (110) surface, each of the structures includes at least one CMOS device of a different conductivity, i.e., nFET 14A and pFET 14B, located on a surface of the substrate 12. Each FET includes a gate dielectric (16A and 16B), a gate conductor (18A and 18B) and at least one sidewall spacer. Optionally, a passivation layer 22 is present on the sidewalls of at least the gate conductors.

The gate dielectric (16A and 16B) present in each of the FETs can comprise the same or different insulating material. For example, the gate dielectric (16A and 16B) can be comprised of an oxide, nitride, oxynitride, high k material (i.e., a dielectric material having a dielectric constant that is greater than silicon dioxide) or any combination thereof including multilayers. Preferably, the gate dielectric (16A and 16B) is comprised of an oxide such as, for example, $SiO_2$. The gate conductor (18A and 18B) can be comprised of the same or different conductive material, including, for example, polySi, SiGe, a metal, a metal alloy, a metal silicide, a metal nitride or combinations including multilayers thereof. When multilayers are present, a diffusion barrier (not shown), such as TiN or TaN, can be positioned between each of the conductive layers. A capping layer (also not shown), such as an oxide, or nitride, can be located atop the gate conductors of each of the FETs. The at least one spacer that is present is typically comprised of an oxide, nitride or oxynitride including combinations and multilayers thereof. In embodiments in which passivation layer 22 is present, that layer is typically comprised of an oxide, nitride or oxynitride.

Each FET (14A and 14B) also includes S/D extensions (25A and 25B) and S/D regions (24A and 24B) which, together with the gate conductor (18A and 18B) define the length of the strained channel (26A and 263). The S/D extensions and S/D regions are comprised of an upper portion of the semiconductor substrate 12 that has been doped with either n-or p-type dopants by ion implantation and/or by in-situ doping during epitaxial growth. The S/D extensions are typically shallower in depth than the S/D) regions.

In some of the structures, e.g., see the structures shown in FIGS. 5A and 5C, a single tensile stressed liner 28 is shown on top of portions of the substrate 12 as well both of the FETs. The tensile stressed liner 28 may comprise a single layer or multiple layers.

The tensile stressed liner 28 is comprised of any stress inducing material such as, for example, a nitride. The tensile stressed liner 28 can formed by various chemical vapor deposition (CVD) processes well known in the art. In one embodiment of the present invention, the tensile stressed liner 28 comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having an intrinsic tensile strain. The stress state (tensile or compressive) of the nitride stress inducing liners deposited by PECVD can be controlled by changing the deposition conditions to alter the reaction rate within the deposition chambers. More specifically, the stress state of the deposited nitride strain inducing liner may be set by changing the deposition conditions such as: $SiH_4/N_2$/He gas flow rate, pressure, RF power, and electrode gap. In the present invention, these conditions are selected to provide a tensile stressed liner 28.

In another example, rapid thermal chemical vapor deposition (RTCVD) can provide a nitride tensile stressed liner 28 having an internal tensile strain. The magnitude of the internal tensile strain produced within the nitride tensile strain inducing liner deposited by RTCVD can be controlled by changing the deposition conditions. More specifically, the magnitude of the tensile strain within the nitride strain inducing liner may be set by changing deposition conditions such as: precursor composition, precursor flow rate and temperature.

In some embodiments of the present invention, e.g., see the structures shown in FIGS. 5B and 5C, tensile stressed embedded wells 32 are present. The embedded wells 32 can be present singly (not shown) or in combination (as shown). The embedded wells 32 are located within the source/drain regions (24A and 24B) and they are typically comprised of a semiconductor material that includes pure Si or Si containing C. Preferably, the tensile stressed embedded wells 32 are comprised of SiC. These epitaxially grown embedded wells may be intrinsic or they may be doped with, for example, B, As, or P.

FIGS. 5A-5C show structures which include compressively stressed STIs 30. The compressively stressed STI regions 30 are comprised of a trench dielectric such as a highly stressed HDP oxide. In some embodiments, a trench fill material deposited from $O_3$/tetraethoxylonesilane (TEOS)-based sub atmospheric CVD, in accordance with the procedure described in R. Arghavani, et al. "Stress Management in Sub-90 nm Transistor Architecture", IEEE Transactions on Electronic Devices, Vol. 51, No. 10, October 2004, pg. 1740, the content of which is incorporated herein by reference, can be used alone or in conjunction with an HDP oxide. The procedure disclosed in the aforementioned article provides a TEOS based dielectric material.

Processing

In general terms, the present invention provides a method of fabricating the structures described above and as are illustrated, for example, in FIGS. 5A-5C, which includes the step forming at least one nFET and at least one pFET located on a semiconductor substrate having a (110) surface, wherein said at least one nFET and said at least one pFET both have a strained channel along a <100> channel direction.

In accordance with the present invention a semiconductor substrate having a (110) surface is used. Such semiconductor substrates are well known to those skilled in the art and are fabricated using techniques that are also well known in the art.

The compressively stressed STI regions 30 can be formed at this time of present invention utilizing processing well known to those skilled in the art including trench isolation formation by first defining a trench into the substrate via lithography and etching. Following the etching step, an optional trench dielectric liner and a trench dielectric are then formed into the trench. Alternatively, a local oxidation of silicon process can be used to define the trench.

After processing the substrate to include at least the STI regions, the FETs are formed on the active area of the substrate. The FETs are formed utilizing any conventional CMOS process that is capable of forming at least one nFET and at least one pFET. One method includes the steps of forming a layered stack comprising a gate dielectric and a gate conductor on the substrate. The gate dielectric can be formed by a thermal process such as oxidation or by a conventional deposition process such as chemical vapor deposition (CVD), plasma enhanced CVD, evaporation, atomic layer deposition and other like deposition processes. The gate conductor is formed by a deposition process such as CVD, PECVD, sputtering, plating, evaporation, atomic layer deposition and the like. When polySi or SiGe gates are used, the conductive material can be doped in-situ or following deposition by ion implantation. Implantation masks and ion implantations are used to form the FETs of different conductivities. Following the formation of the layered stack, at least the gate conductor (and optionally the gate dielectric) is patterned by lithography and etching. A thermal process can then be used to form the passivation layer. Thereafter, S/D extensions are formed by ion implantation and annealing. Sidewalls spacers are then formed by deposition and etching and thereafter the S/D regions are formed by ion implantation and annealing. The annealing step used for activating the S/D extension can be omitted and activation can occur during the activation of the S/D regions.

Other techniques such as, for example, a replacement gate process can be used in forming the FETs.

In cases in which a stressed liner is present, the tensile stressed liner 28 is formed by deposition and etching, after the FETs devices have been formed. Examples of deposition processes that can be used include, CVD, PECVD or RTCVD. The etching step includes providing a patterned resist over portions of the stressed inducing layer and then etching the exposed portions of the stressed liner.

In cases in which the embedded wells are formed, the CMOS device is first provided in each of the active areas. Next, exposed portions of the substrate are recessed by an etching process (RIE and/or wet etch or in situ etch during epi), preferably to provide a slight undercut beneath each of the spacers. That is, a selective anisotropic or isotropic etching process can be used to remove portions of the substrate. The isotropic etch provides the slight undercut beneath the spacers. Following the recessing process in which an etch is used, the etched surfaces are cleaned utilizing any cleaning process that can remove contaminates including residual oxides from the recessed surfaces. A selective epitaxial growth process (RTCVD or UHVCVD) can than be used to form the embedded wells. In embodiments in which RTCVD (rapid thermal CVD) is used, the following conditions are typically used: deposition temperature of about 500° C. to about 1000° C., pressure from about 5 to about 100 Torr, and a precursor comprising a Si source such as a silane, a disilane, or a dichlorosilane, or a C source such as an alkene. Alternatively, it is possible that the embedded wells can be formed by gas phase doping into the S/D regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a semiconductor substrate having a (110) surface; and
   at least one nFET and at least one pFET located on said semiconductor substrate, wherein both of said at least one nFET and said at least one pFET both have a strained channel along a <100> channel direction, and both of said at least one nFET and said at least one pFET are located on the (110) surface, wherein said strained channel is a result of a single tensile stressed liner over said at least one nFET and said at least one pFET and a compressively stressed STI region between said at least one nFET and said at least one pFET, wherein carrier mobility in the strained channel for both the at least one nFET and the at least one pFET is increased when compared to a similar device in which the tensile stressed liner and the compressively stressed STI region are removed.

2. The semiconductor structure of claim 1 further comprising a tensile stressed embedded well.

3. The semiconductor structure of claim 1 wherein said semiconductor substrate is a bulk semiconductor material or a semiconductor-on-insulator.

4. The semiconductor structure of claim 1 wherein said strained channel has a uniaxial longitudinal tensile stress and a transverse compressive stress.

5. A semiconductor structure comprising:
a semiconductor substrate having a (110) surface; and
at least one nFET and at least one pFET located on said semiconductor substrate, wherein said at least one nFET and said at least one pFET both have a strained channel along a <100> channel direction, said strained channel is a result of having a single tensile stressed liner covering said at least one nFET and said at least one pFET, a compressively stressed STI region between said at least one nFET and said at least one pFET and a tensile stressed embedded well located within each source/drain region of said at least one nFET and said at least one pFET, and both of said at least one nFET and said at least one pFET are located on the (110) surface, wherein carrier mobility in the strained channel for both the at least one nFET and the at least one pFET is increased when compared to a similar device in which the tensile stressed liner and the compressively stressed STI region are removed.

6. The semiconductor structure of claim 5 wherein said strained channel has a uniaxial longitudinal tensile stress and a transverse compressive stress.

7. A semiconductor structure comprising:
a semiconductor substrate having a (110) surface; and
at least one nFET and at least one pFET located on said semiconductor substrate, wherein said at least one nFET and said at least one pFET both have a strained channel along a <100> channel direction having a uniaxial longitudinal tensile stress and a transverse compressive stress, said strained channel is a result of having a single tensile stressed liner covering said at least one nFET and said at least one pFET and a compressively stressed shallow trench isolation in said semiconductor substrate between said at least one nFET and said at least one pFET, and both of said at least one nFET and said at least one pFET are located on the (110) surface, wherein carrier mobility in the strained channel for both the at least one nFET and the at least one pFET is increased when compared to a similar device in which the tensile stressed liner and the compressively stressed STI region are removed.

8. The semiconductor structure of claim 7 further comprising a tensile stressed embedded well located within each source/drain region of said at least one nFET and said at least one pFET.

9. A method of forming a semiconductor structure comprising:
forming at least one nFET and at least one pFET on an upper Si-containing layer of a semiconductor substrate, said upper Si-containing layer having a (110) surface, wherein said at least one nFET and said at least one pFET both have a strained channel along a <100> channel direction, wherein each of said strained channels is a result of forming a single tensile stressed liner on each of said at least one nFET and said at least one pFET, a compressively stressed shallow trench isolation (STI) region located within said substrate and between said at least one nFET and said at least one pFET, and a tensile-stressed embedded well within each source/drain region of said at least one nFET and said at least one pFET.

10. A method of forming a semiconductor structure comprising:
forming at least one nFET and at least one pFET located on an upper semiconductor layer of a semiconductor substrate, said upper semiconductor layer having a (110) surface, wherein said at least one nFET and said at least one pFET both have a strained channel along a <100> channel direction, wherein each of said strained channels is a result of at least forming a compressively stressed STI region.

11. The method of claim 10 wherein each of said strained channels is a result of forming a single tensile stressed liner and forming said compressively stressed STI region.

12. The method of claim 10 wherein each of said strained channels is a result of forming said compressively stressed STI region and forming a tensile stressed embedded well.

13. The method of claim 10 wherein each of said strained channels is a result of forming a single tensile stressed liner, forming said compressively stressed shallow trench isolation (STI) region, and forming a tensile stressed embedded well.

\* \* \* \* \*